United States Patent
Ho

(10) Patent No.: US 6,953,360 B2
(45) Date of Patent: Oct. 11, 2005

(54) REDUCED CONTACT RESISTANCE ELECTRICAL CONNECTOR

(75) Inventor: Yi-Tse Ho, Bai-ha Chen (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/464,915

(22) Filed: Jun. 19, 2003

(65) Prior Publication Data

US 2004/0038579 A1 Feb. 26, 2004

(30) Foreign Application Priority Data

Jun. 21, 2002 (TW) .................................. 91209400 U

(51) Int. Cl.$^7$ ...................... H01R 13/625; H01R 4/50
(52) U.S. Cl. ............................................... 439/342
(58) Field of Search .................................. 439/342–343, 439/259, 296, 858–861

(56) References Cited

U.S. PATENT DOCUMENTS

| | | | | |
|---|---|---|---|---|
| 5,492,488 A | * | 2/1996 | Hsu | 439/342 |
| 5,622,514 A | * | 4/1997 | Crompton et al. | 439/342 |
| 6,056,576 A | * | 5/2000 | Szu | 439/342 |
| 6,074,233 A | * | 6/2000 | Lin | 439/342 |
| 6,247,954 B1 | * | 6/2001 | Ju | 439/342 |
| 6,328,587 B1 | * | 12/2001 | Hsu | 439/342 |

* cited by examiner

Primary Examiner—Michael C. Zarroli
(74) Attorney, Agent, or Firm—Robert J. Zeitler

(57) ABSTRACT

An electrical connector includes an insulating housing, a cover, a plurality of electrical terminals, and an actuation device, wherein the insulating housing has a plurality of through holes having a projection extending into the through hole from an inner wall thereof, the cover having a plurality of passages is disposed on the insulating housing, which is mobile between the open position and the locked position, and the electrical terminal having a contact member received into the through hole. The contact member contacting against the projection provides a preload which results in a corresponding decreases in the contact resistance and the power, thereby minimizing the likelihood that the device installed into the electrical connector will be damaged by an increase in temperature.

20 Claims, 8 Drawing Sheets

$F = F1 + F2$

REDUCED CONTACT RESISTANCE ELECTRICAL CONNECTOR

FIELD OF THE INVENTION

The present invention relates to an electrical connector. More particularly, the present invention relates to an electrical connector for inserting a device with a plurality of pins, such as CPU and the like, in applying to an electrical circuit.

DESCRIPTION OF RELATED ART

Taiwan patent application Ser. No. 90202961 and No. 89208847 both disclose a ZIF (Zero Insertion Force) socket connector for inserting a device with a plurality of pins, such as a CPU, in applying to an electrical circuit comprising an insulating housing 10a, a cover 20a, a plurality of passages 21a, a plurality of electrical terminals 30a, and an actuation device 40a. The insulating housing 10a has a plurality of through holes respectively corresponding to the pins. The cover 20a is disposed on the insulating housing 10a being mobile between an open position, where a CPU can be inserted into the ZIF socket connector, and a locked position, where the CPU is retained within the ZIF socket connector, relative to the insulating housing 10a. The electrical terminal 30a is disposed in the passage 21a providing by the cover 20a. The actuation device 40a includes a spindle 41a parallel connecting to the cover 20a, and an eccentric camshaft 42a connecting between the cover 20a and the insulating housing 10a. The cover 20a is mobile between the open position and the locked position relative to the insulating housing 10a by rotating the eccentric camshaft 42a.

The pin of the device mentioned-above, such as a CPU, contacting the electrical terminal 30a of the electrical connector generates a force (F) and a contact resistance (R) corresponding with the force by the formula:

$$R \propto \frac{1}{\sqrt{F}}$$

$$W = I^2 R$$

Where R, F, W, R, and I respectively represents the contact resistance, the force, a power, a resistance, and an electric current.

According to the formula mentioned-above, the contact resistance (R) is inversely proportional to the force (F); the power (W) is in direct ratio with the resistance (R). As the force (F) applied by the CPU pin to the electrical terminal decreases, the contact resistance (R) and the power (W) correspondingly increase, and the temperature rises to disturb the normal operation of devices, such as the CPU and the like.

Hence, an improved electrical connector is required to overcome the disadvantages of the prior art in an effort to minimize, if not prevent, the deleterious effects of the temperature rise occasioned by increased contact resistance between the CPU and the electrical terminal of the ZIF socket connector.

SUMMARY OF THE INVENTION

The object of the invention is therefore to reduce the contact resistance between the device installed into the ZIF socket connector and the electrical terminals of the ZIF socket connector. The contact resistance can be decreased by having a projection extending from a wall of a passage in the electrical connector insulating housing place a preload on the contact member of the electrical terminal. The contact member is imposed on both by one force of preloading and by another force resulting from contacting the electrical terminal with the pin of the device while the pin is inserted into the ZIF socket connector. As the total force imposed on the contact member increases, the contact resistance and the power correspondingly decrease for preventing disturbing the normal operation of devices by reducing the heat generated by the contact resistance.

According to the invention, this object may be achieved by an electrical connector includes an insulating housing having a plurality of through holes, a cover disposed on the insulating housing having a plurality of passages, and a plurality of electrical terminals having a fixing member, wherein the through hole has a projection sticking on an inner wall thereof to apply a preload to the electrical terminal. The cover is mobile between the open position and the locked position relative to the insulating housing, and the electrical terminal may also include a tail member and a resilient member both connecting to a bottom of the fixing member. The through hole includes the resilient member of the terminal therein, and a projection extending from an inner wall of the through hole contacts against the contact member of the electrical terminal for preloading.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

The drawings included herein provide a further understanding of the invention. A brief introduction of the drawings is as follows.

DETAILED DESCRIPTION OF THE DISCLOSED EMBODIMENTS

Figure 1:
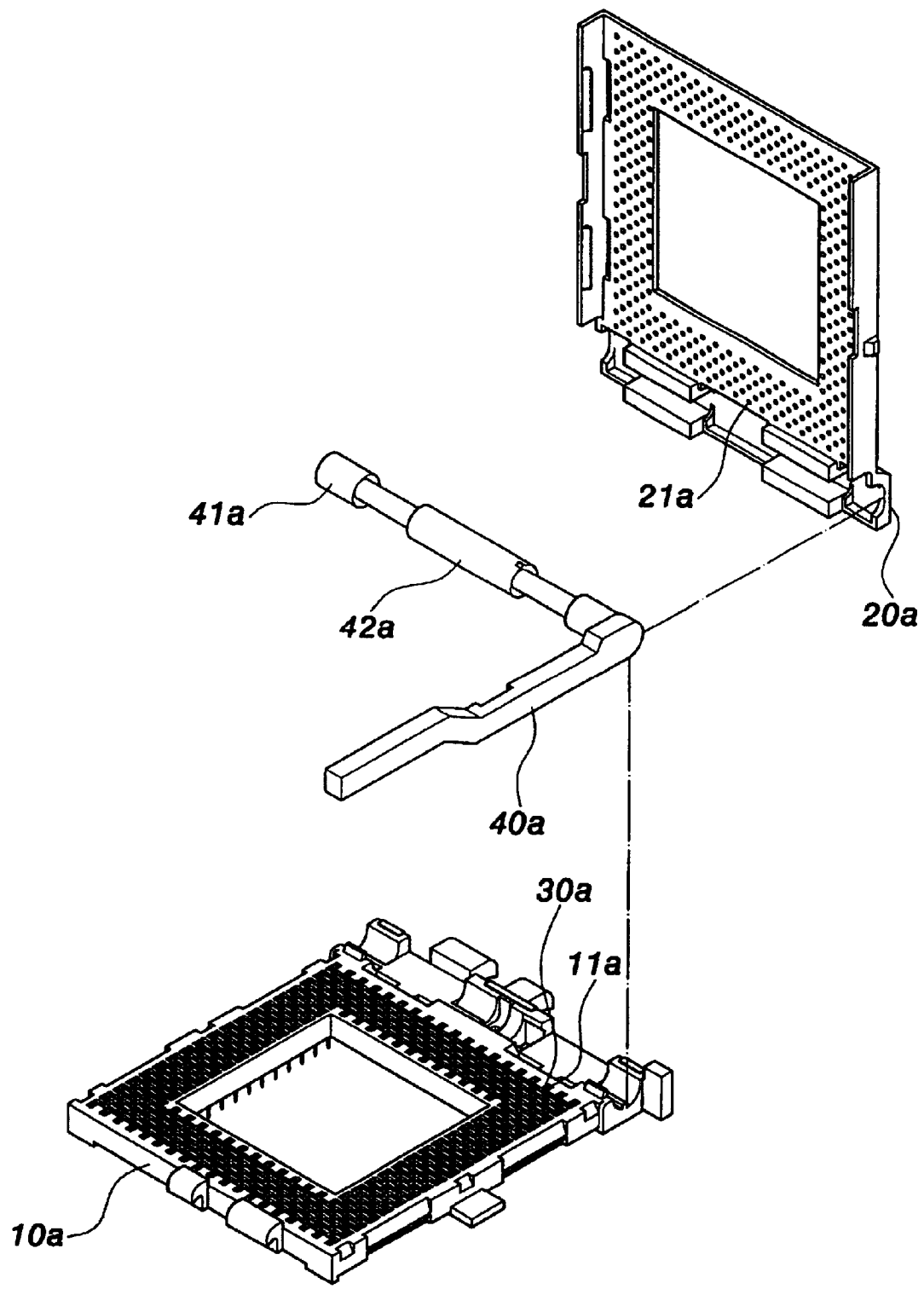
FIG. 1 is a decomposition view of prior art electrical connector.
Figure 2:
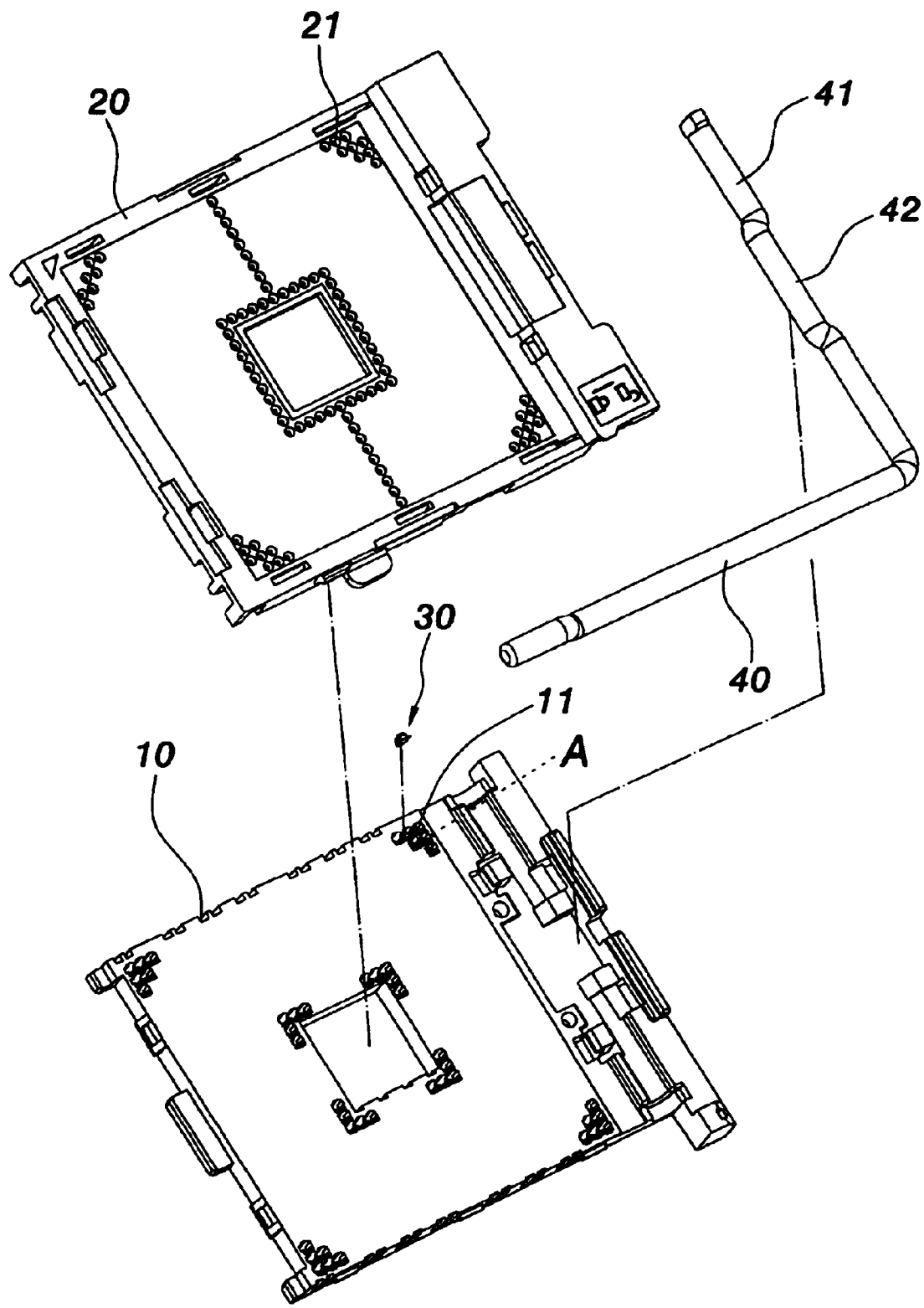
FIG. 2 is a decomposition view according to an electrical connector of the present invention.
Figure 2A:
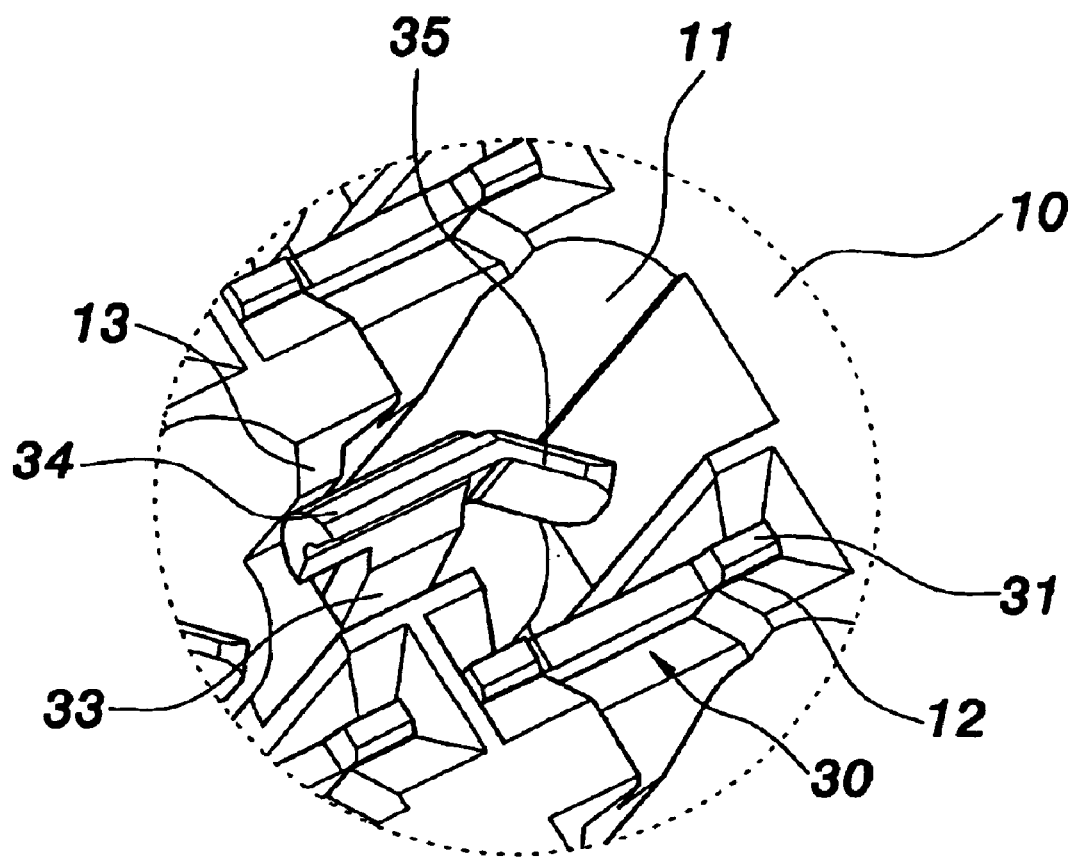
FIG. 2A is a detail perspective view of section A of the present invention.
Figure 3:
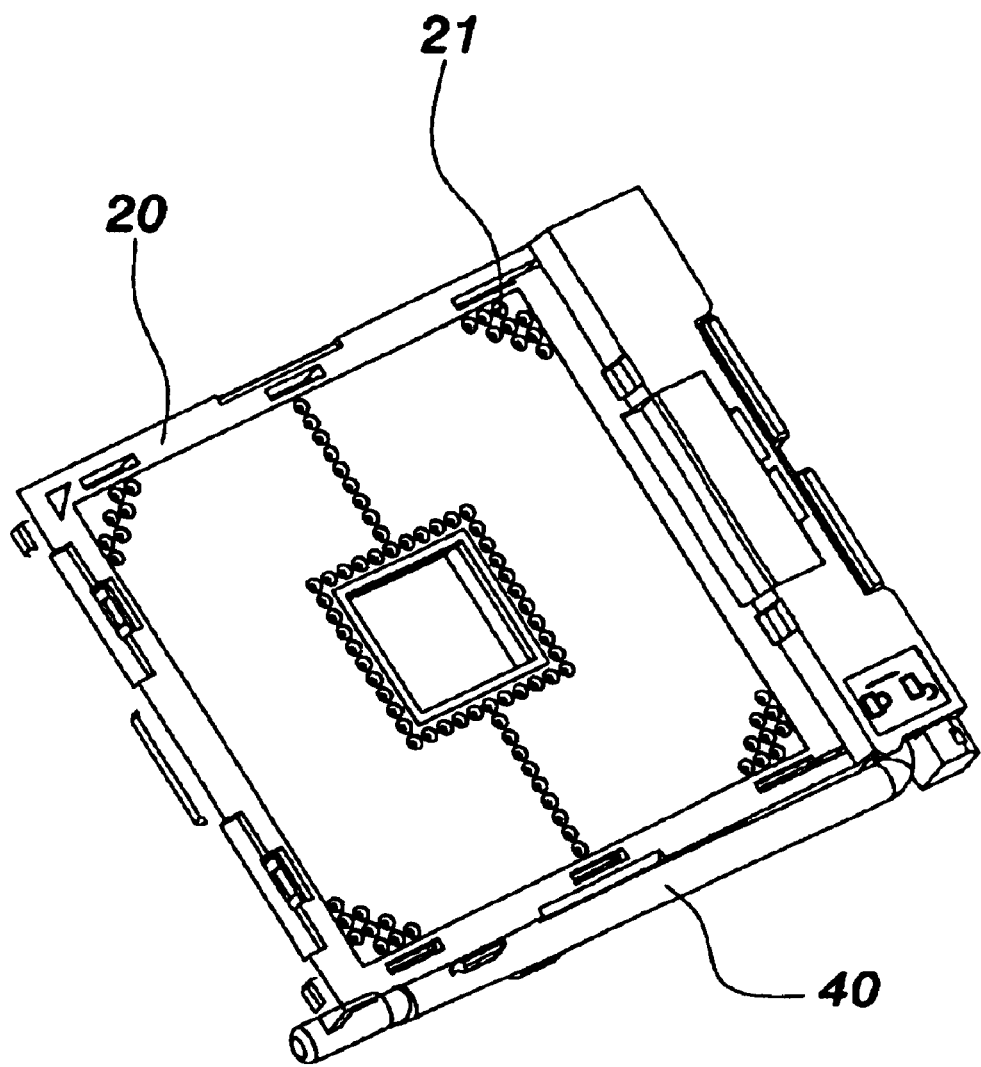
FIG. 3 is a perspective view according to the electrical connector of the present invention.

Referring to the decomposition view in FIG. 2, FIG. 2A, and the perspective view in FIG. 3 according to present invention, the present invention provides a type of ZIF socket connector for inserting a device with a plurality of pins, such as CPU and the like, in applying to an electrical circuit, which is comprising an insulating housing 10, a cover 20, a plurality of electrical terminals 30, and an actuation device 40 Wherein the insulating housing 10 includes a plurality of through holes 11 for containing respectively corresponding to a plurality of pins 50.

The cover 20 is disposed on the insulating housing 10 being mobile between the open position and the locked position. The cover 20 has a plurality of passages 21 respectively corresponding for passing through the pins 50.

The electrical terminal 30 is disposed in the through hole 11. The actuation device 40 includes a spindle 41 parallel connecting to the cover 20, and an eccentric camshaft 42 connecting between the cover 20 and the insulating housing 10, whereby the cover 20 is mobile between an open position (shown as FIG. 5) and an locked position (shown as FIG. 6) relative to the insulating housing 10 by rotating the eccentric camshaft 42.

Figure 4:
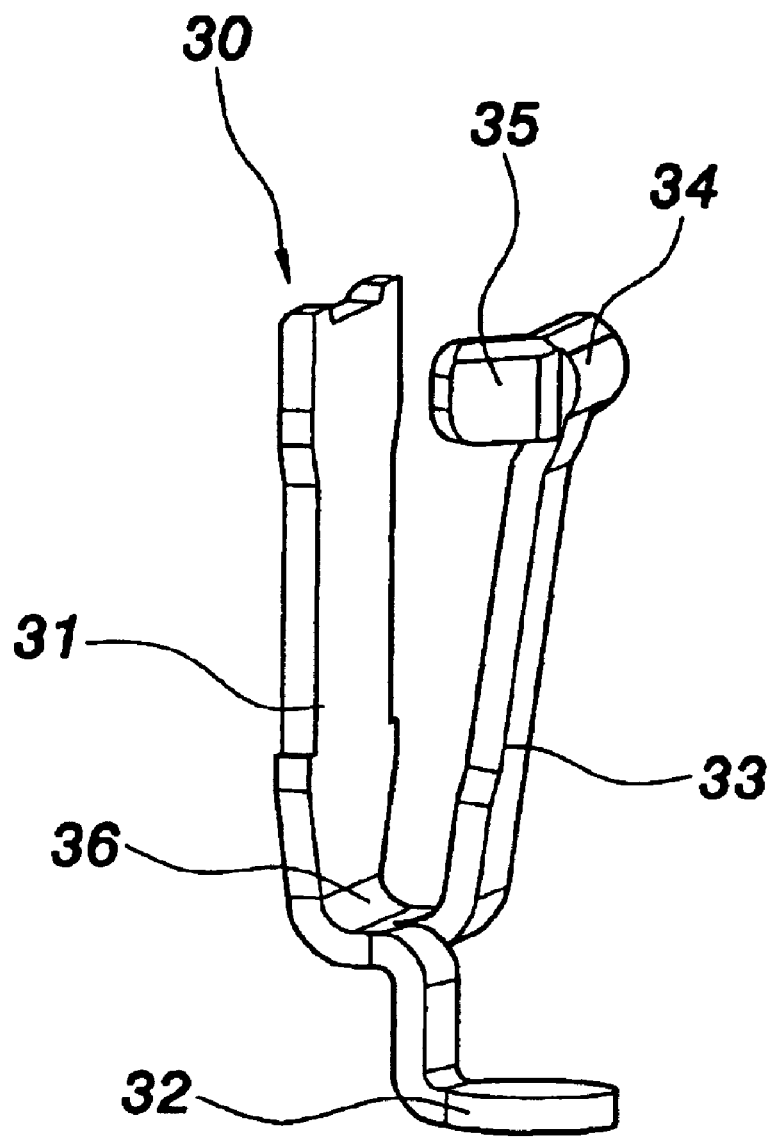
FIG. 4 is a perspective view according to an electrical terminal of the present invention.

The present invention provides improvements on the electrical terminal 30 and the through hole 11 of the insulating housing 10. The electrical terminal 30 (shown as FIG. 4) is made of an electrically conductive material including an up straight fixing member 31, a tail member 32 connecting to a bottom of the fixing member 31, and a resilient member 33 upwards extending from the bottom of the fixing member 31 having an equal height thereof. The tail member 32 folded as being L-shaped solders to the electrical circuit for electrical connecting therebetween. The resilient member 33 and the fixing member 31 define a U shape with a radius R 36 increasable according to different requirements. The resilient member 33 includes a contact member 34 connecting to a top thereof. The contact member 34 includes a guiding member 35 adjacent to an end thereof and being at an angle relative to the contact member 34 for guiding the pin 50 to allow contact between the pin and the contact member 34.

Figure 7:
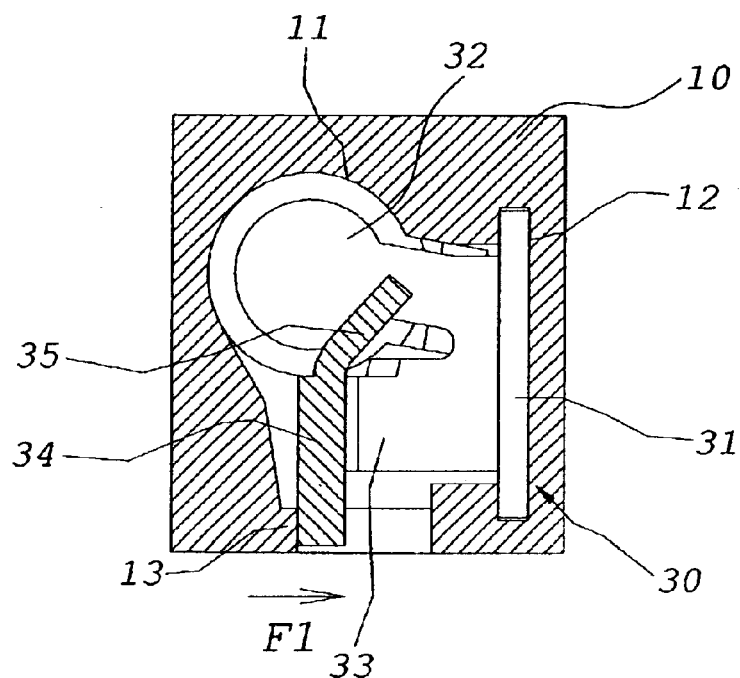
FIG. 7 is a profile of a plane figure according to the electrical terminal of the present invention received in each of the through holes.
Figure 8:
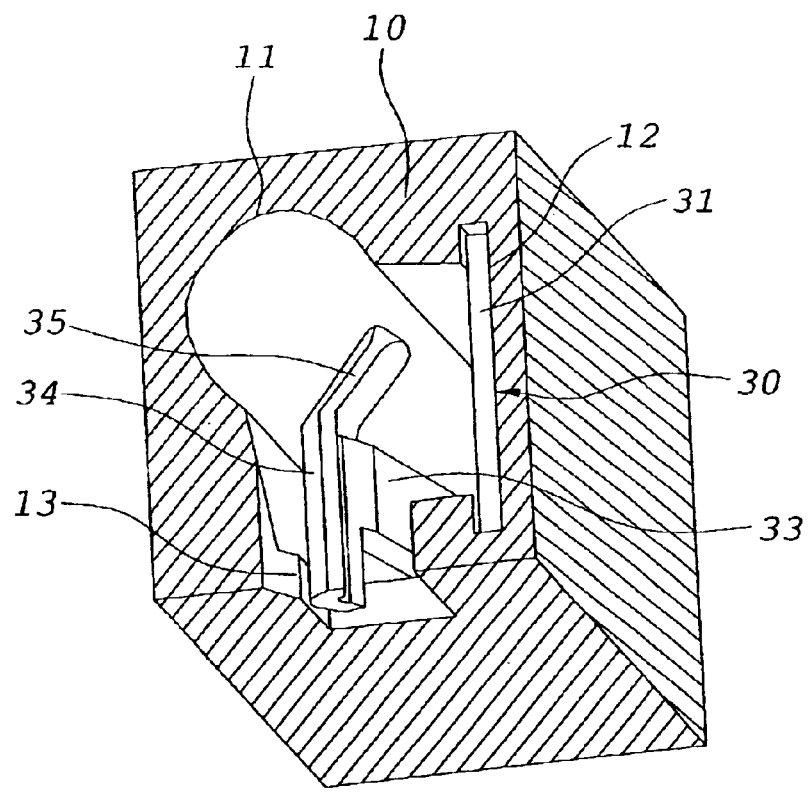
FIG. 8 is a cross section of perspective view according to the electrical terminal of the present invention in each of the through holes.

Referring to FIGS. 7 and 8, the through hole 11 has a fixing slot 12 at an inner side for fixing the electrical terminal 30. The electrical terminal 30 installs in the through hole 11 in accordance with the fixing member 31 embedded to the fixing slot 12. The through hole 11 further includes a projection 13 sticking on an inner wall thereof against the contact member 34 of the electrical terminal 30 for preloading the contact member of the electrical terminal.

Figure 5:
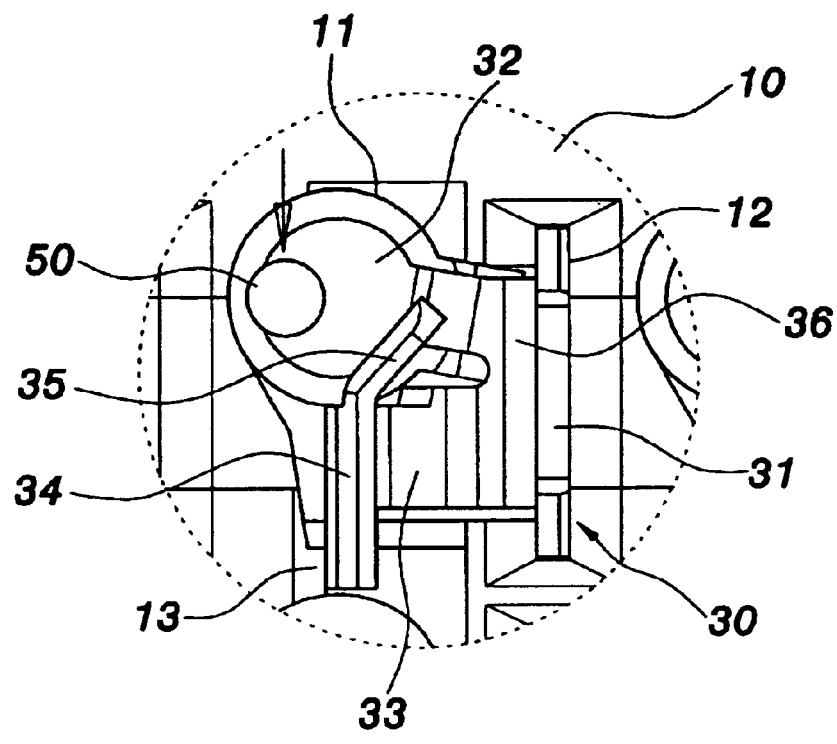
FIG. 5 is an enlarged perspective view according to the electrical terminal of the present invention in the open position with the pin.
Figure 6:
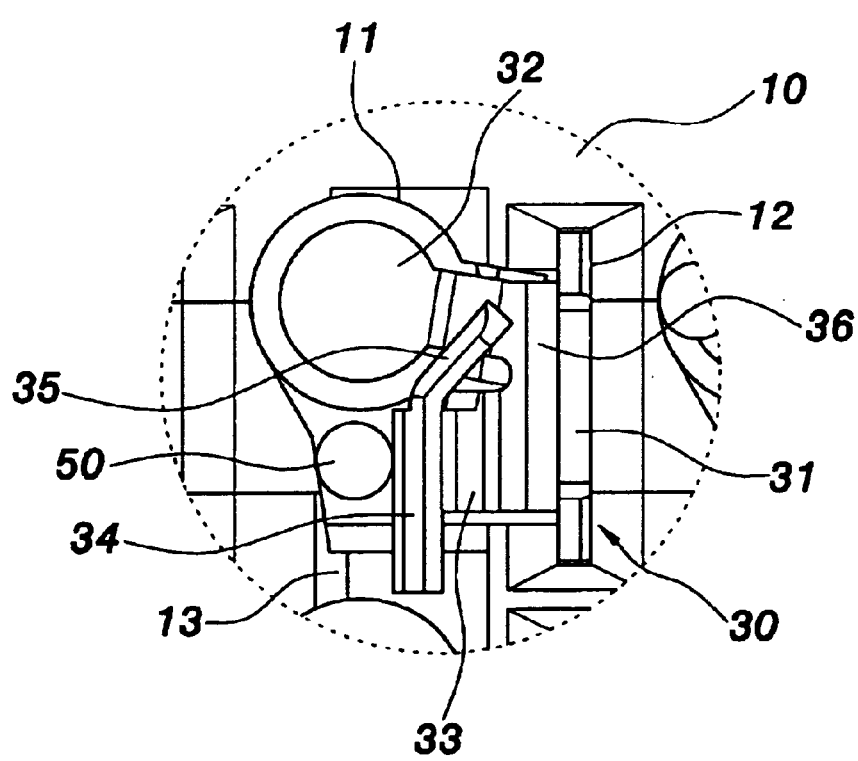
FIG. 6 is an enlarged perspective view according to the electrical terminal of the present invention in the locked position with the pin.
Figure 9:
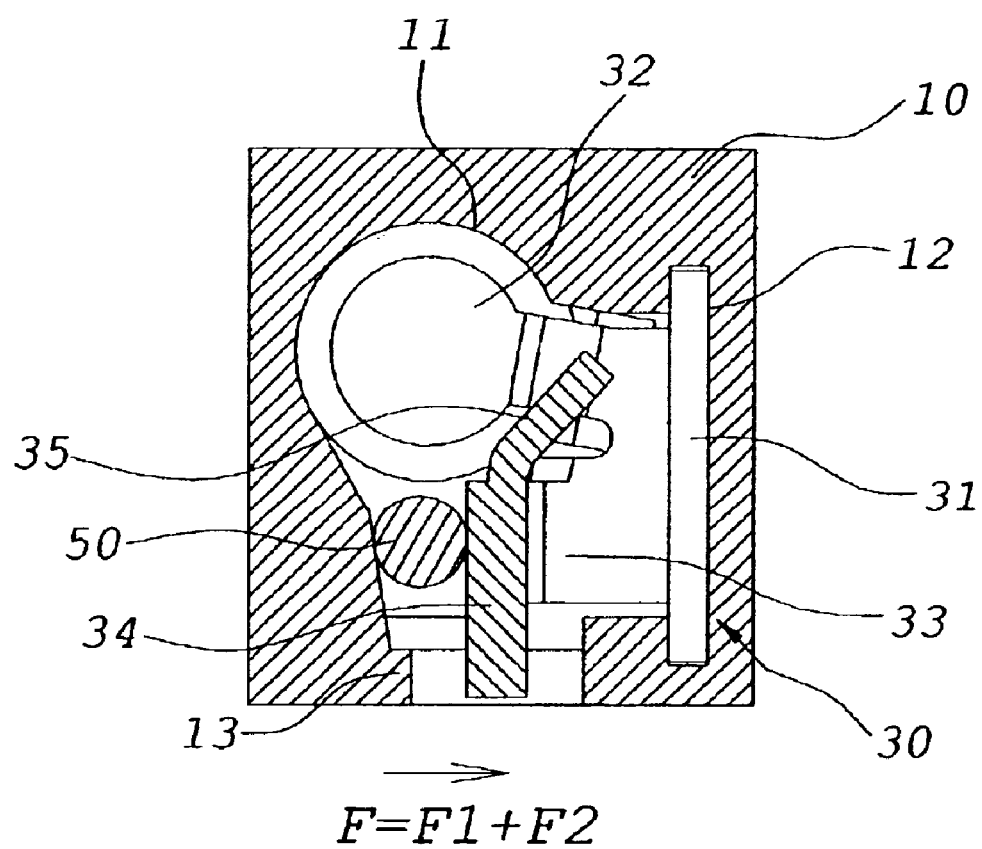
FIG. 9 is a profile of a plane figure according to the electrical terminal of the present invention in the conjunction state with the pin.

Referring to the perspective view in FIGS. 5, 6 and 9, the pin 50 inserts into the through hole 11 of the insulating housing 10 through the passage 21 of the cover 20 in the way with zero insertion force, and thereafter the actuation device 40 drives the cover 20 mobile from the open position (shown as FIG. 5) to the locked position (shown as FIGS. 6 and 9) with moving the pin 50 inside the through hole 11 along the guiding member 35 for electrical contacting to the contact member 34, so as to the pin 50 of the device is electrical connecting to the electrical circuit.

The through hole 11 of the insulating housing 10 of the present invention includes the projection 13 against the contact member 34 for preloading with a force F1 in advance (shown as FIGS. 5 and 7), and the pins 50 each contacting the contact member 34 imposes another force F2 thereon (shown as FIGS. 6 and 9). The contact member 34 therefore imposes on both by the force F1 of preloading of the projection 13 and by the force F2 of the pin 50

As the total force (F) imposed on the contact member 34 of the electrical terminal 30 increases, the contact resistance (R) and the power (W) correspondingly decrease for preventing disturbing the normal operation of devices from lowering the temperature.

The prior art ZIF socket connector has no preloading mechanism, and a contact member of each of the electrical terminals is hard to orient a relative predetermined position in assembly, while each of the electrical terminals has a tolerance generating in the manufacturing process. On the contrary, the present invention has a preloading mechanism to orient each of the electrical terminals 30 at a relative predetermined position in assembly and increases the total force (F), reduces the contact resistance (R), and consequently decreases the power (W) and the heat.

Furthermore, the present invention adjusts the force of preloading by variation of the radius R 36. That means the larger the radius R 36 is, the larger the preload force.

The present invention mentioned-above is a big improvement on prior art connector with less contact resistance resulting from the smaller force generated by the pin contacting against the contact member. With less contact resistance, increases in the power and a corresponding rise in the temperature disturbs the normal operation of the device mounted to the connector, such as a CPU.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An electrical connector comprising:
    an insulating housing including a plurality of through holes having a projection extending from an inner wall thereof;
    a cover disposed on the insulating housing, the cover being mobile between an open position and a locked position, and having a plurality of passages; and
    a plurality of electrical terminals respectively received in the through holes, the electrical terminals including a resilient member having a contact member located proximate a distal end of the resilient member for contacting against the projection, the contact between the contact member and the projection resulting in a preload being applied to the contact member and wherein the contact member has a guiding member at an end thereof being at an angle relative to the contact member.

2. The electrical connector of claim 1, wherein the electrical terminal further includes a fixing member for retaining the electrical terminal within the through hole.

3. The electrical connector of claim 2, further including a radius R formed between the fixing member and the resilient member.

4. The electrical connector of claim 3, wherein the fixing member and the resilient member each extend upward from opposite ends of the radius R.

5. The electrical connector of claim 3, wherein the fixing member and the resilient member each extend upward an equal distance from opposite ends of the radius R.

6. The electrical connector of claim 2, wherein the through hole has a fixing slot for receiving the fixing member.

7. The electrical connector of claim 1, wherein the electrical terminal further includes a fixing member, and wherein the resilient member and the fixing member define a radius R.

8. The electrical connector of claim 1, further comprising an actuation device including a spindle parallel to the cover, and an eccentric camshaft between the cover and the insulating housing, whereby the cover is mobile between the open position and the locked position relative to the insulating housing by rotating the eccentric camshaft.

9. The electrical connector of claim 3, wherein increasing the radius R increases the preload applied to the contact member by the projection.

10. The electrical connector of claim 7, wherein increasing the radius R increases the preload applied to the contact member by the projection.

11. The electrical connector of claim 1, wherein the electrical terminal includes a tail member at a location furthest away from the contact member.

12. The electrical connector of claim 3, wherein the tail member extends from the radius R in a direction away from the contact member.

13. The electrical connector of claim 7, wherein the tail member extends from the radius R in a direction away from the contact member.

14. An electrical connector comprising:

an insulating housing including a plurality of through holes having a projection extending from an inner wall thereof;

a cover disposed on the insulating housing, the cover being mobile between an open position and a locked position, and having a plurality of passages; and a plurality of electrical terminals respectively received in the through holes, the electrical terminals including a resilient member having a contact member located proximate a distal end of the resilient member for contacting against the projection, wherein the contact member extends away from the resilient member in a first direction and a second direction which is generally opposed from the first direction, the contact between the contact member and the projection results in a preload being applied to the contact member on that portion of the contact member that extends from the resilient member in a first direction and the portion of the contact member that extends for the resilient member in a second direction is capable of making contact with a contact portion of a mating electrical terminal.

15. The electrical connector of claim 14, further comprising an actuation device including a spindle parallel to the cover, and an eccentric camshaft between the cover and the insulating housing, whereby the cover is mobile between the open position and the locked position relative to the insulating housing by rotating the eccentric camshaft.

16. The electrical connector of claim 14, wherein the electrical terminal includes a tail member at a location furthest away from the contact member.

17. The electrical connector of claim 14, wherein the electrical terminal further includes a fixing member for retaining the electrical terminal within the through hole.

18. The electrical connector of claim 17, further including a radius R formed between the fixing member and the resilient member.

19. The electrical connector of claim 18, wherein the fixing member and the resilient member each extend upward from opposite ends of the radius R.

20. The electrical connector of claim 18, wherein the fixing member and the resilient member each extend upward an equal distance from opposite ends of the radius R.

* * * * *